United States Patent [19]

Reams

[11] Patent Number: 4,585,727
[45] Date of Patent: Apr. 29, 1986

[54] FIXED POINT METHOD AND APPARATUS FOR PROBING SEMICONDUCTOR DEVICES

[75] Inventor: Donald J. Reams, Santa Clara, Calif.

[73] Assignee: Probe-Tronics, Inc., Santa Clara, Calif.

[21] Appl. No.: 635,110

[22] Filed: Jul. 27, 1984

[51] Int. Cl.[4] ............................ G03C 5/00; G01R 1/04
[52] U.S. Cl. ..................................... 430/312; 430/311; 430/314; 430/318; 430/319; 430/329; 430/394; 324/158 P
[58] Field of Search ............... 430/313, 314, 315, 318, 430/319, 320, 312, 394, 311, 329; 324/158 P

[56] References Cited

U.S. PATENT DOCUMENTS

| | | | |
|---|---|---|---|
| 3,810,016 | 5/1974 | Chayka et al. | 324/158 P |
| 4,065,717 | 12/1977 | Kattner et al. | 324/158 P |
| 4,329,642 | 5/1982 | Luthi et al. | 324/158 F |
| 4,382,228 | 5/1983 | Evans | 324/158 F |

Primary Examiner—John E. Kittle
Assistant Examiner—José G. Dees
Attorney, Agent, or Firm—Thomas E. Schatzel

[57] ABSTRACT

A method of making a probe ring including the steps of providing a substrate, forming the maximum number of traces possible on the substrate, forming the appropriate number of pads on the substrate using the pad mask for making electrical contacts for the semiconductor device, forming appropriate lines of electrical connection between the traces and the pads, and plating the pads to a height to provide adequate clearance between the substrate and the semiconductor device.

Additionally disclosed is a method of making a fixed point probe apparatus including providing a probe card having an opening sized and shaped for mating with the probe ring and inserting the ring in the opening.

14 Claims, 12 Drawing Figures

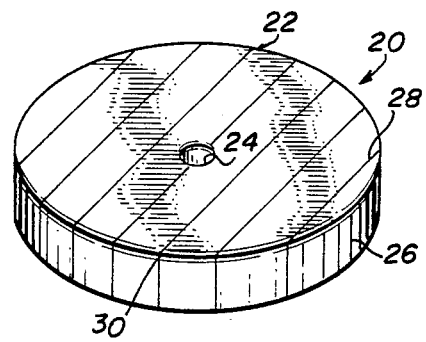
Fig_1
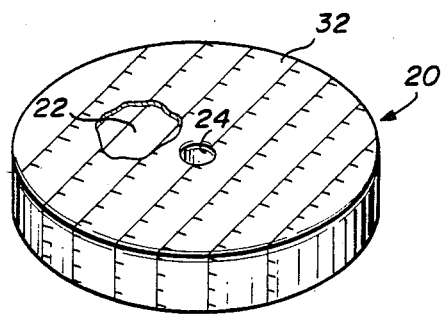
Fig_2
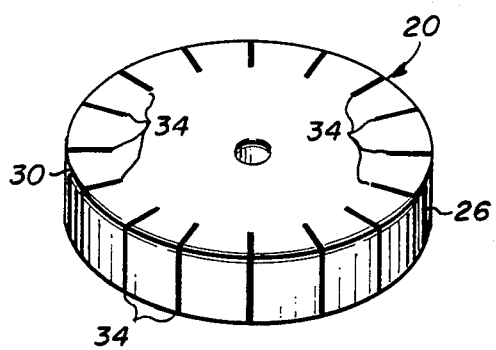
Fig_3
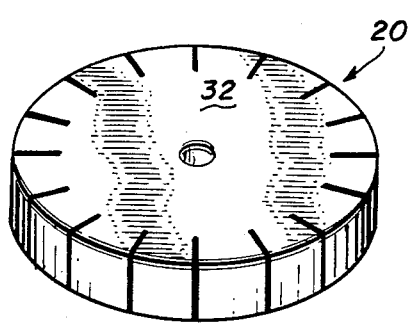
Fig_4
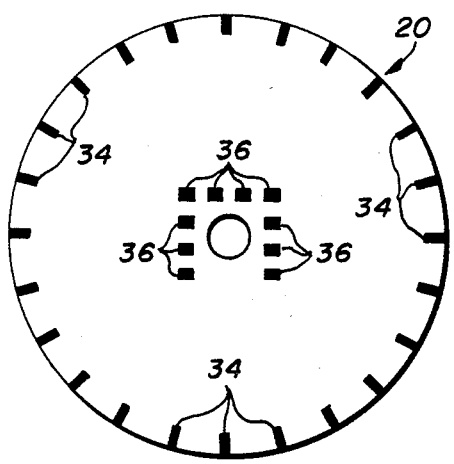
Fig_5
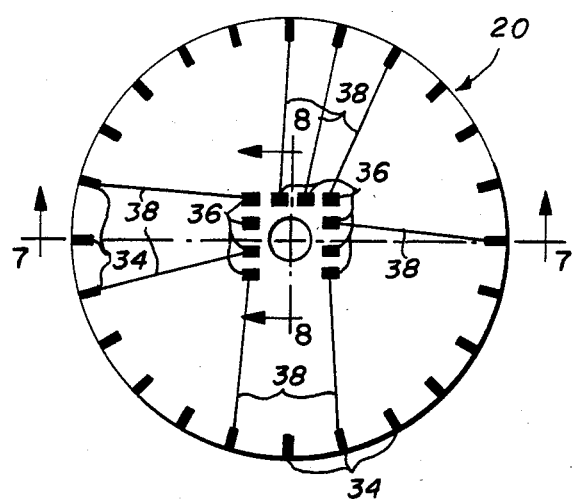
Fig_6

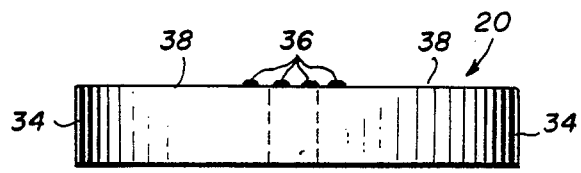
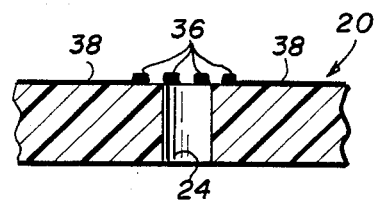
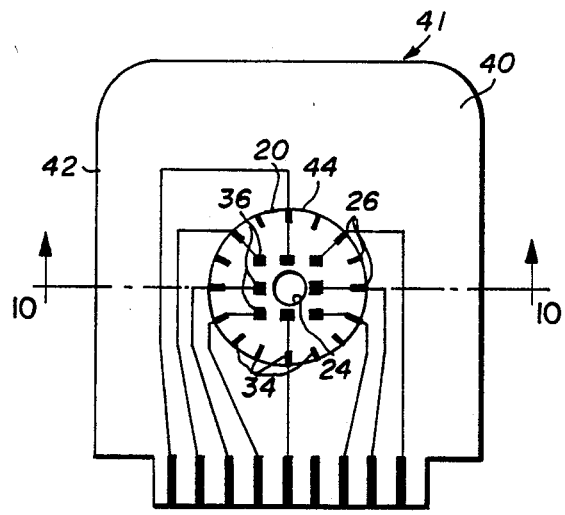
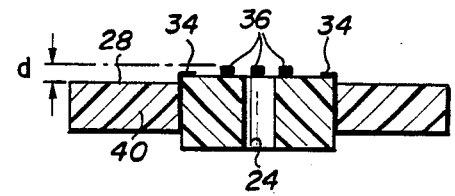
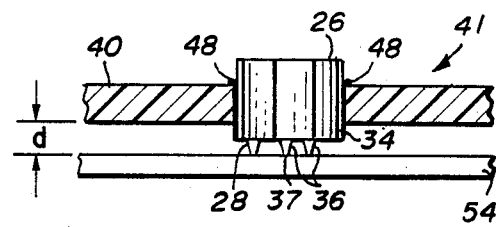
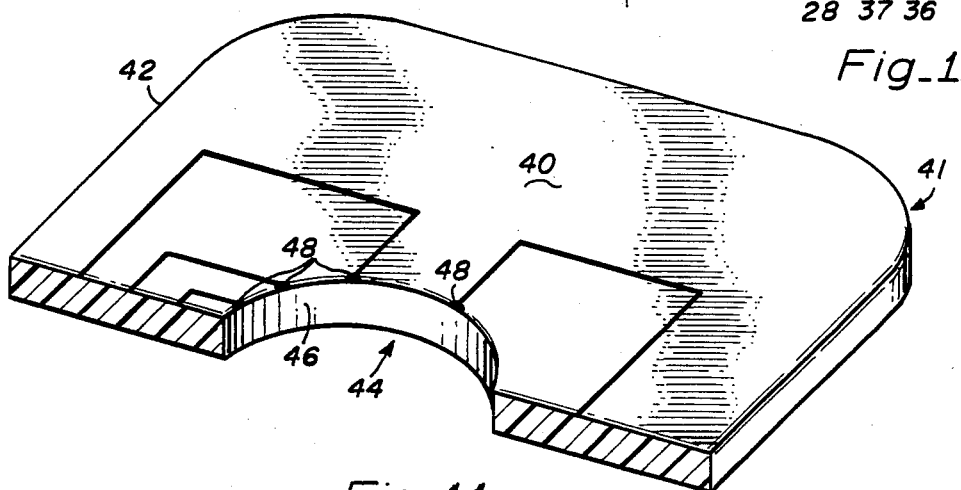

FIXED POINT METHOD AND APPARATUS FOR PROBING SEMICONDUCTOR DEVICES

BACKGROUND OF THE INVENTION

1. Field of the Invention

This invention relates generally to testing the electrical integrity of semiconductor devices, and more particularly to apparatus for and methods of for testing high density semiconductor devices by the fixed point probe method.

2. Description of the Prior Art

A number of fixed point probe devices have previously been disclosed. Chayka, et al, U.S. Pat. No. 3,810,016, discloses a microprobe for testing beam-lead semiconductor devices. The contact elements are photoetched from a blank and embedded into a plastic insulator. Chayka, et al recognized the need for providing mechanical fabrication and assembly techniques for fixed point probes. However, the contact element of Chayka, et al is assembled separately from the ring binder adding costs and expense.

Kattner, et al, U.S. Pat. No. 4,065,717, discloses a probe assembly which includes a mounting plate having a port portion with an opening, a transparent disk designed to fit within the opening and a backing card sized and shaped to fit compatibly with the mounting plate. The backing card is flexible and sheet-like having electronic circuitry connected to an appropriate readout. The transparent disk includes a plurality of probes for electrically connecting a semiconductor device with the backing card. The probes, as illustrated in FIG. 8 of Kattner, are wire-like.

Luthi et al, U.S. Pat. No. 4,329,642 discloses a carrier and test socket for a leadless integrated circuit package and discloses a carrier having a plurality of leads the carrier having a central opening. The leads have a cantilevered end which extends over the cavity and which may be brought into electrical contact with the semiconductor device. One embodiment of the carrier includes a lead frame which is formed from a sheet of material such as copper by photoresist masking and chemically etching a plate to form the desired lead pattern. A chip is provided to maintain the semiconductor device in fixed position to the carrier during testing.

The common industrial practice, is to make probe cards from discrete components mounted on a board. For example, U.S. Pat. No. 4,382,228 issued to Evans discloses a fixed point probe anchored on a probe card. The probe is a rigid holder having a deflectable needle extending therefrom to engage a respective contact of a semiconductor device. There are a plurality of such needles which physically engage the contacts or pad areas of the semiconductor device. As will be appreciated, the pad areas of a typical semiconductor device, e.g. a wafer or chip, comprise a top layer of aluminum, a second layer of silica oxide ($SiO_2$) and a bottom layer of silicone. In typical operation, the needles of the probe pierces the aluminum layer of each pad area. It is highly desirable not to do damage to the pad area so that the semiconductor device will function properly after testing. If uneven pressure is applied to the aluminum, snowplowing can result causing improper contact for the semiconductor device when in use. Additionally, it is typical to test the probe needle using a load resulting in 15,040 psi. Should there be uneven pressure, a load of greater than 18,000 psi could result. It will be appreciated that the glass layer has stress failure at greater than 18,000 psi. Thus, uneven pressure can cause the $SiO_2$ layer to have micro cracks.

Additionally, in order for the needle to make electrical contact with the semiconductor device, the needle is ordinarily scrubbed, further causing snowplowing and uneven pressure. A more detailed explanation of the problems associated with probing a semiconductor device by probe needles is set forth in *Probing Techniques: Evolution, Practice and Prediction*, Frank Ardezzone (Probe-Rite 1973).

As will be appreciated from the foregoing, the plurality of needles must be almost exactly at the same height. The industry wide standard for height tolerance of the needles is 0.1 mil. The process for accomplishing this is known as planarization. In planarizing fixed probe needle type boards, manual sanding or filing are necessary to bring the needles within required tolerance range. Manual manipulation of this type can cause damage to the probe card as well as the probe needle itself. It will be appreciated that a large number of hours are required by a skilled operator to accomplish planarization. Even then, industry complaints have arisen because of damage to the semiconductor devices, needles and probes.

Another problem associated with prior art needle type probe boards, is that the probe needles take up a relatively large amount of space in connecting them to the probe card. In the case of high density semiconductor devices, two or more cards may be needed in order to conduct the test. Current commercially available test apparatus are not capable, in one step, of testing the number of contact points in current semiconductor devices. Further, design criteria of semiconductor devices are now being restricted by commercially available test equipment, particularly probes not having sufficient contact points and probes which too often damage semiconductor devices.

The attention directed at the testing of semiconductor devices is constantly increasing. It has become imperative that manufacturers of semiconductor devices be able to test their product quickly, efficiently and thoroughly.

Manual testing of a semiconductor device having several hundred (perhaps thousand) contacts, may be impossible as well as financially impractical. The need of the industry is for a probe apparatus which can be inexpensively made and which will free designers to create even more radical semiconductor devices. The probe apparatus must be capable of being used by unskilled operators while maintaining excellent standards for reliability.

SUMMARY OF THE PRESENT INVENTION

It is therefore an object of the present invention to provide an apparatus which in one step can test a semiconductor device having a high density of contact points.

It is another object of the present invention to provide a method of making such an apparatus by a mechanized process.

It is another object of the present invention to provide a standardized fixed point probe ring.

Briefly, a preferred embodiment of the present invention includes a fixed point probe ring, a fixed point probe ring apparatus and a standardized fixed point probe ring and methods for making them. The method, in accordance with this invention for making a probe ring includes providing a rigid, insulating substrate having a face, sides and an edge region joining them. The substrate is coated with a conductive material and traces are formed on the sides and edge region by a mechanized process. Pads are formed on the face of the substrate by a mechanized process and electrically conductive lines are formed between the traces and pads. The pads are plated with a conductive material by a mechanized process to a height sufficient to allow clearance between the substrate and the semiconductor device.

The apparatus includes pads which have a matching configuration of the semiconductor device contacts. In fact the pad mask of the semiconductor device may be used when forming the pads to assure electrical connection between the pads and contacts of the semiconductor device.

The standardized fixed point probe ring is made by the same method described above except that the maximum number of traces are formed dependant upon the number of pads of the semiconductor device to be tested. Subsequently, the particular semiconductor device to test is chosen. This means that an inventory of probe rings can be maintained at a nominal cost to the manufacturer. When a particular semiconductor device is chosen, the pads are formed, preferably using the pad mask of the semiconductor device and the remaining steps described above are carried out.

The steps for making a fixed point probe apparatus in accordance with this invention includes the steps of making a probe ring described above and providing a probe card having an opening sized and shaped to accommodate the probe ring. The probe card opening defines side walls which include electrical contacts for metering electrically with the traces of the ring. The card further includes appropriate circuitry for connection with other test equipment. The ring is inserted into the card opening such that the traces and contacts mate electrically.

By utilizing a mechanized step for joining the traces, the traces can be made as small as one micron wide. Thus, many traces may be joined to the pads on a single ring. The lines of connection are made preferably by using thin-film techniques. This allows the traces and pads to be connected with sufficient spacing to provide insulation between the lines.

The plating operation is advantageously used to plate the base of the pad to a height of 0.005. The pad may then include a tip of 0.002 defining a point for gently passing the aluminum layer.

An advantage of the probe ring and apparatus in accordance with the present invention is that a great number of probe pads are provided for connection with high density semiconductor devices.

Another advantage is that the ring and apparatus may be made inexpensive and with great reliability.

Another advantage is that plating the pads to a sufficient height by a mechanized process means, the pad will be well within the 0.1 mil tolerance range and no planarization is required.

Another advantage is that an inventory of standardized probe rings may be stored, assuring a manufacturer of adequate supplies.

These and other objects and advantages of the present invention will no doubt become obvious to those of ordinary skill in the art after having read the following detailed description of the preferred embodiment which are illustrated in the various drawing figures.

IN THE DRAWING

FIG. 1 illustrates the step of coating a substrate with conductive material in accordance with this invention to form a probe ring;

FIG. 2 illustrates, in schematic form, the step of coating the substrate of FIG. 1 with photoresist material;

FIG. 3 illustrates the step of forming traces on the substrate of FIG. 1;

FIG. 4 illustrates, in schematic form, the step of coating the substrate of FIG. 1 after forming the traces;

FIG. 5 illustrates the step of forming pads on the substrate of FIG. 1;

FIG. 6 illustrates the step of forming electrically connecting lines between the traces and the pads;

FIG. 7 is a cross-sectional view of the substrate taken along line 7—7 of FIG. 6 illustrating the step of layering;

FIG. 8 is an enlarged cross-sectional view of the substrate taken along line 8—8 of FIG. 6 illustrating in more detail the step of layering;

FIG. 9 is a plan view of a probe apparatus in accordance with this invention;

FIG. 10 is a cross-sectional view of a probe apparatus in accordance with this invention taken along line 10—10 of FIG. 9;

FIG. 11 is an enlarged cross-sectional view of the probe card of FIG. 9; and

FIG. 12 is an enlarged cross-sectional view of the probe apparatus of FIG. 9 in electrical contact with a semiconductor device.

DETAILED DESCRIPTION OF THE PREFERRED EMBODIMENTS

FIGS. 1-6 illustrate the various steps following to produce a probe ring of the present invention. Referring to FIG. 1, there is shown a rigid substrate 20 coated with an electrically conductive material 22. The substrate has a center hole 24 for inking the traces as will be more fully appreciated hereinafter. The substrate has sides 26 and a face 28. An edge region 30 is formed where the sides 26 join the face 28.

FIG. 2 illustrates the initial step of forming traces on the sides and edge region of substrate 20. The substrate 20 is coated with photoresist material 32 over the material 22. It will be appreciated that this coating can be accomplished by hand, but to lower manufacturing costs and to maintain uniform quality, among other advantages, the preferred method of coating with photoresist 32 is by a mechanized process.

The coated substrate 20 is then exposed to form the maximum number of traces possible along the sides 26 and at the edge region 30. The maximum number of traces is in great part limited by the size of the substrate 20 and the width of the traces which are dependent on the particular mechanized process used. Typical photoresist and thin film methods will produce in excess of 180 traces on a single ring of normal size. Laser apparatus are projected to produce greater than 3000 and perhaps as many as 5000 traces. Alternatively, the traces may be formed by a pattern generator or digitizing process. Also an electron beam may be used.

FIG. 3 illustrates the substrates 20 having a plurality of traces 34 formed over the face 28, along the sides 26 and at the edge region 30. The traces 34 are formed by etching after the photoresist 32 has been developed. After forming the desired maximum number of traces 34 possible on the substrate 20, a standard fixed point probe ring has been made. One advantage of making a fixed point probe ring according to this invention, is that there will typically be many more traces 34 than contact points on a semiconductor device to be tested. As will be appreciated more fully hereinafter, the probe ring thus made can be used with almost all semiconductor devices. The probe ring shown in FIG. 3 can then be stored for use with a particular semiconductor device as the need arises.

After a particular semiconductor device has been chosen for testing, pads are formed on the probe ring from FIG. 3 by a mechanized process. As illustrated in FIG. 4, the substrate 20 is re-coated with photoresist 32. Alternatively, if the first coating of photoresist 32 from FIG. 2 is still usable, this step may be avoided. The photoresist may be rendered unusable by time, temperature and/or humidity. Additionally, it may have been desirable to strip the photoresist 32 before storage for other reasons.

A pad mask (not shown) is applied to the face 28 of substrate 20 of FIG. 4. The pad mask is applied to pad regions which, after formation, will provide a suitable pattern for electrical connection with the contacts of the semiconductor device. The pad regions are then exposed to define pads 36 as shown in FIG. 5.

The substrate 20 is then masked to define lines 38 of electrical connection between the traces 34 and pads 36. The substrate 20 is exposed to form lines 38 as shown in FIG. 6 which electrically connect the traces 34 with the pads 36. The lines 38 may be formed by any suitable mechanized process, e.g. a pattern generator.

The present method includes using a light pen with a point source of light to paint the lines 38. This method is advantageous in that the lines 38 have a width of one micron. Other methods include the use of lasers or electron beam which will enable the lines 38 to be 0.5 microns wide.

A further step of the method of making a fixed point probe ring in accordance with the instant invention may include layering the pads 36. The pads 36 are layered to provide adequate clearance between the ring and the semiconductor device. The pads 36 electrically connect with contacts of the semiconductor device. Typically, there is physical connection between the pads 36 and the contacts of the device to be tested. Typical semiconductor devices tend to be extremely delicate. Should the entire substrate 20 contact the semiconductor device, permanent damage will likely result to the semiconductor device under test. The layering process will be explained with particular reference to FIGS. 7 and 8.

The entire substrate 20 is coated with a thin layer of hard, electrically conductive material, e.g. chromium, by a sputtering process. The substrate 20 is re-coated with photoresist and the pads are exposed. Chrome serves as a good conductive material because it adheres well and is resistant to wear and makes excellent electrical connections. Additionally, chrome has been found to sputter well for the purposes of the instant invention. The pads 36 are plated to the desired height by an electrolytic plating process or a controlled sputtering method. Typically, the pad height is between 0.002 and 0.005 inches. It is particularly advantageous to use the mechanical process in accordance with this invention of layering the pads 36 because the pads 36 are virtually of equal height.

The planarization steps of prior fixed probe ring devices is virtually eliminated using the method of the instant invention. The planarization step in the prior art has proven very costly and time consuming. A skilled operator must sand or file the pads to the same height within a tolerance of 0.1 mil. Manipulation by the operator can cause damage to the ring and the semiconductor device. If the pads are not within the tolerance range, the pressure on at least one contact of the semiconductor device under test may be sufficiently great to destroy the device. With the ring made in accordance with the present invention, greater pressure can be applied between the ring and the device to be tested because the pads 36 are virtually at the same height. Sufficient pressure may be applied such that the pads 36 easily pierce the aluminum layer of the contacts for positive electrical connection with no permanent damage to the semiconductor device under test. The necessary pressure is thus applied with great confidence.

After layering, the photoresist material is stripped from the substrate yielding a finished fixed point probe ring according to the method of the present invention.

The probe ring is now inserted into a probe card 40 as shown in FIG. 9 to create a fixed point probe card apparatus, referred to by the general reference character 41. As seen, the probe card 40 may be a standard probe card comprising a printed circuit board having an opening 44 (as best seen in FIG. 11) sized and shaped to accommodate the substrate 20. In this particular embodiment, the probe ring 20 is forced fit into the opening 44 with the surface of the probe ring extending 1/16" above the surface of the probe card 40 as seen in FIG. 10. The opening 44 defines side walls 46 in the card 40. The side walls forms tangent areas for mating electrically with the traces 34 along the top of side wall 26 of substrate 20. The traces 34 are then joined to tangent areas 48 by standard bonding or soldering techniques. The electrical contacts 48 extend along the top surface of the board 40 to electrically connect to contact points 50 by printed circuitry on the printed circuit board 40.

With particular reference to FIG. 12 there is shown the fixed point probe apparatus 41 in electrical contact with a semiconductor device, in this case a wafer 54. The face 28 of the ring 20 is inverted and becomes the bottom of the probe apparatus 41. As will be explained more fully hereinafter, the pads 36 have a tip 37 for piercing the oxide and aluminum layers of the wafer 54. As pointed out previously, a probe apparatus in accordance with the invention needs no planarization with respect to the semiconductor device. The desired clearance distance "d" between the tip 37 and the face of the probe card 40 is fixed when the ring 20 is permanently bonded to probe card 40 as shown in FIG. 9. Typically, the distance of equals 0.144 inch, but this may vary.

In Use

In order to test a semiconductor device having a plurality of contacts, the probe apparatus 41 is inserted into other testing equipment. Examples of such testing equipment are shown in U.S. Pat. Nos. 4,382,228 and 4,065,717 which are incorporated herein by reference. The probe apparatus 41 of FIG. 9 is inserted in the probing machine to make electrical contact with a mating structure of the machine, such as previously described after the contacts 50 have been electrically mated with the test equipment, the electrical contacts of the device to be tested are mated to the pads 36 and the semiconductor device is then checked for electrical integrity.

Each of the elements of the probe ring 20 and probe apparatus 41 as well as the method has been set forth above. It will be appreciated that there are significant variations which may be useful to the user of the instant invention. Some of the variations and features will now be explained in detail.

Substrate

The substrate 20 is made from insulating material. Thus when the traces 34, pads 36 and lines 38 of electrical connection therebetween are formed, their electrical integrity is preserved. The substrate 20 is rigid to support the semiconductor device and the various mechanical operations performed with it. The substrate 20 is additionally machinable and capable of withstanding localized high heat, such as from soldering. A glass slug of approximately 1.00 inch diameter made from quartz has been found preferable. It additionally has the advantage of being transparent which aids in the alignment of the pads 36 and semiconductor device contacts. The slug can be machined to any shape, e.g. rectangular or square. Thus, in some cases the probe ring may have a rectangular shape. The slug has a center hole for an inker which is used to mark defective dies. It will be appreciated that the face 28 of the substrate 20 is a bottom face to provide ease in connection between the ring and semiconductor device.

Electrically Conductive Material

The glass slug is preferably sputtered with the conductive material 22. The material 22 should adhere solidly to the glass and have high electrical conductivity. The material 22 should sputter easily and quickly. It is further preferred that the material 22 meet all of the above requirements and only require a single coating. In addition, the material 22 is sputtered in a thin layer and can be soldered to easily. Tungsten has been found to be such a material.

Traces

The traces 34 are formed through masking projected traces, applying photoresist material, and then subsequently exposing and developing same. This process is carried out by mechanized process and techniques such as digitizing and utilizing a pattern generator described above. Other mechanized processes include using a laser or an electron beam, or plasma. The alternative means may prove especially useful in forming densely packed traces. It is projected that up to 5000 or more traces are possible.

Current thin film techniques will provide at least 180 and more traces even on a small ring. It is believed that 360 or more traces using above described techniques are a practical reality.

Pads

The pads 36 may be formed by using the pad mask used to form the electrical contacts of the semiconductor device. This will help assure electrical compatibility with the semiconductor device. In forming the pads 36, chrome is sputtered through the pad mask. The pads 36 are plated if desired to a point of 0.002 inch as seen in FIGS. 10 and 12. Plating techniques used in making disks for Winchester drives may prove useful in plating relative to this invention. The pad point serves to pierce the aluminum layer of the semiconductor device to be tested. The pads are contacted gently, so as not to permanently damage the semiconductor device. Typically, the layer is 4500 Å thick and is aluminum. The chrome being a much harder material easily pieces the aluminum and oxide layer for positive electrical connection with the contact. As previously explained, the pads 36 are already in virtually the same plane (typical tolerance range is 0.05 mil or better) and no planarization is required. An additional advantage derived from this is that no scrubbing of the contact is necessary, as is typically done with known devices.

Lines of Connection

The lines of connection 38 between traces 34 and pads 36 may be very closely spaced in high density applications. Current light pen techniques may be replaced with electron beam or laser techniques for connecting the traces 34 and pads 36. The alternative techniques will be especially valuable in high density applications since the lines can be made 0.5 microns wide, or less. This will provide enough space between the lines 38 even on small rings to prevent electrical contact.

Although the present invention has been described in terms of the presently preferred embodiments, it is to be understood that such disclosure is not to be interpreted as limiting. Various alterations and modifications will no doubt become apparent to those skilled in the art after having read the above disclosure. Accordingly it is intended that the appended claims be interpreted as covering all alterations and modifications as fall within the true spirit and scope of the invention.

I claim:

1. A method of making a fixed point probe ring for use in testing a semiconductor device having a plurality of electrical contacts, the steps comprising:
   providing a rigid substrate of insulating material having sides and a face, and an edge region joining the sides and face;
   coating the substrate with an electrically conductive material;
   forming a plurality of traces on said sides and said edge region of the substrate by a photoresist exposure, development and etching process;
   forming pads on said face of the substrate by a photoresist exposure and development process, the pads are formed in a pattern to electrically connect with the contacts of the semiconductor device;
   forming lines of electrical connection between the traces and the pads by a photoresist exposure and development process; and
   layering the pads with electrically conductive material to provide clearance between the substrate and the semiconductor device, whereby when the contacts of the semiconductor device are brought into electrical connection with the pads of the probe ring the semiconductor device can be tested for electrical integrity.

2. A method as set forth in claim 1 wherein the steps for the photresist exposure process of forming traces, pads and lines of connection, comprises:
   coating the conductive layers with photoresist material;
   masking the substrate on said sides and said edge region for forming the maximum of traces possible;
   exposing and developing said traces;
   etching said traces;
   masking the substrate for forming the appropriate number of pads in the appropriate pattern;
   exposing and developing said pads;
   masking the substrate for forming lines of connection;

exposing and developing said lines of connection; and depositing said lines of connection and said pads with electrically conductive material.

3. A method as set forth in claim 1 wherein the steps of layering comprises:
sputtering the substrate with a hard electrically conductive material;
coating the substrate with photoresist material;
exposing and developing said pads; and
plating said pads to height to provide adequate clearance.

4. A method as set forth in claim 3 wherein the photoresist is stripped from the substrate.

5. A method as set forth in claim 1 wherein the electrically conductive material used for coating the substrate is tungsten.

6. A method as set forth in claim 1, wherein, greater than 180 traces and pads are formed.

7. A method as set forth in claim 1, wherein greater than 1000 traces and pads are formed.

8. A method as set forth in claim 1, wherein the pads are layered with chromium.

9. A method as set forth in claim 1, wherein the pads are layered to a height of between 0.002 and 0.005 of an inch.

10. A fixed point probe ring made by the method of:
providing a rigid substrate of insulating material having sides and a face, and an edge region joining the sides and face;
coating the substrate with an electrically conductive material;
coating the conductive layer with a photoresist material;
masking the substrate for forming traces on said sides and said edge region;
exposing and developing said traces to form a plurality of traces on said sides and said edge region of the substrate by a photoresist exposure process; etching said traces;
masking the substrate for forming the appropriate number of pads in the appropriate pattern, exposing and said developing pads
on said face of the substrate by a photeresist exposure process, the pads are formed in a pattern to electrically connect with contacts of the semiconductor device;
masking the substrate for forming lines of connection, exposing and developing said lines of connection to form lines of electrical connection between the traces and the pads by a photoresist exposure process; and
layering the pads with electrically conductive materials to provide clearance between the substrate and the semiconductor device, whereby when the contacts of the semiconductor device are brought into electrical connection with the pads of the probe ring the semiconductor device can be tested for electrical integrity.

11. A method of making of fixed point probe apparatus for use testing semiconductor devices, the steps comprising:
forming a probe ring by providing a rigid substrate of insulating material having sides and a face, and an edge region joining the sides and face, coating the substrate with an electrically conductive material, forming a plurality of traces on said sides and said edge region of the substrate by a photoresist exposure, development and etching process, forming pads on said face of the substrate by a photoresist exposure and development process, the pads are formed in a pattern to electrically connect with the contacts of the semiconductor device, forming lines of electrical connection between the traces and the pads by a photoresist exposure and development process;
layering the pads with electrically conductive material to provide clearance between the substrate surface and the top surface of said pads, whereby when the contacts of the semiconductor device to be tested are brought into electrical connection with the pads of the probe ring the semiconductor device can be tested for electrical integrity;
providing a probe card having an opening sized and shaped to accomodate the probe ring, the opening defining side walls and the side walls having electrical contacts in a predetermined pattern a match said traces on the sides of the ring, the probe card further including appropriate electrical circuitry for connection with a testing device; and
inserting the ring into the opening with the traces and the contacts electrically mating.

12. A fixed point probe ring for use in testing a semiconductor device, comprising:
a rigid substrate made from insulating material having sides and a face, and an edge region joining the sides and faces; and
a coating of electrically conductive material over the substrate, the electrically conductive material being formed into a plurality of traces and pads for electrically mating with the semiconductor device by a photoresist exposure, development and etching process, the traces being electrically connected to the pads, and the pads being layered with an electrically conducted material to provide electrical connection between the probe ring and the semiconductor device and to provide adequate clearance therebetween.

13. A method of making a standard fixed point probe ring for use in testing semiconductor devices, the step comprising:
providing a rigid substrate made from insulating material having sides and a face, and an edge region joining the sides and face;
coating the substrate with an electrically conductive layer; and
forming by a photoresist exposure, development and etching process the maximum number of traces possible on the substrate along the sides and at the edge region, whereby the probe ring may be stored for future use with semiconductor devices.

14. A method of making a fixed point probe ring from standardized fixed point probe ring, the steps comprising:
making a standardized fixed point probe ring as set forth in claim 13;
masking the face of the substrate for forming pads;
forming pads by a photoresist exposure and development process to electrically connect with the semiconductor device;
forming electrical lines of connection by a photoresist exposure and development process between the pads and the traces; and
layering the pads with electrically conductive material to provide adequate clearance between the substrate and the semiconductor device.

* * * * *